United States Patent [19]

Anthony et al.

[11] 4,035,199
[45] July 12, 1977

[54] PROCESS FOR THERMAL GRADIENT ZONE MELTING UTILIZING A GUARD RING RADIATION COATING

[75] Inventors: Thomas R. Anthony; Harvey E. Cline, both of Schenectady, N.Y.

[73] Assignee: General Electric Company, Schenectady, N.Y.

[21] Appl. No.: 718,976

[22] Filed: Aug. 30, 1976

[51] Int. Cl.² .......................................... H01L 21/24
[52] U.S. Cl. .............................. 148/1.5; 148/171; 148/172; 148/186; 148/177; 148/179; 252/62.3 GA; 252/62.3 E
[58] Field of Search ........... 148/1.5, 171, 172, 186, 148/187, 188, 177, 179; 252/62.3 E, 62.3 GA

[56] References Cited

U.S. PATENT DOCUMENTS

| | | | |
|---|---|---|---|
| 2,813,048 | 11/1957 | Pfann | 148/1 |
| 3,895,967 | 7/1975 | Anthony et al. | 148/1.5 |
| 3,956,023 | 5/1976 | Cline et al. | 148/171 X |
| 4,001,047 | 10/1976 | Boah | 148/1.5 |

Primary Examiner—G. Ozaki
Attorney, Agent, or Firm—Donald M. Winegar; Joseph T. Cohen; Jerome C. Squillaro

[57] ABSTRACT

The practice of thermal gradient zone melting in processing a body of semiconductor material is enhanced by providing a radiation coating on selected surface areas of the body.

14 Claims, 7 Drawing Figures

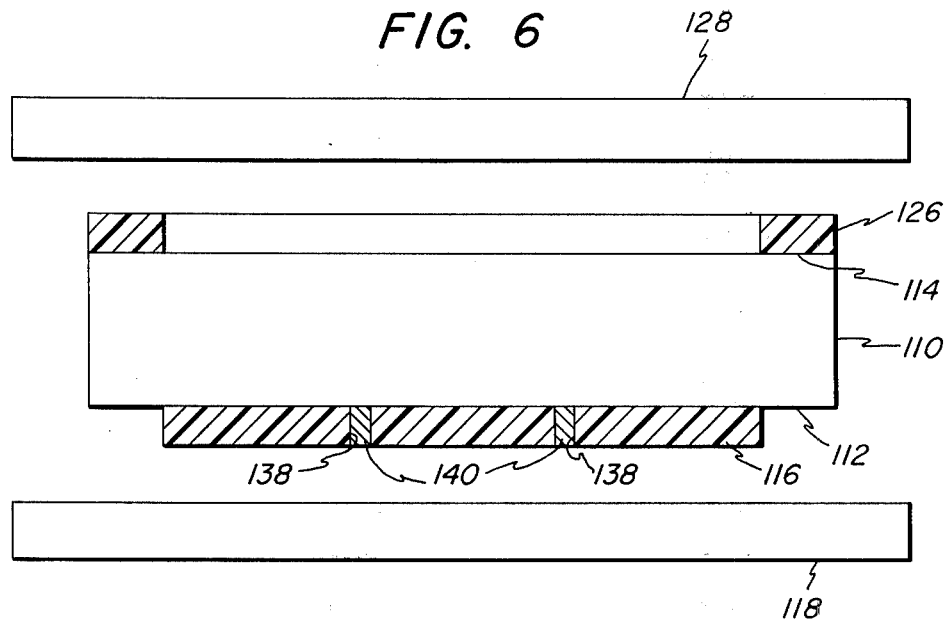
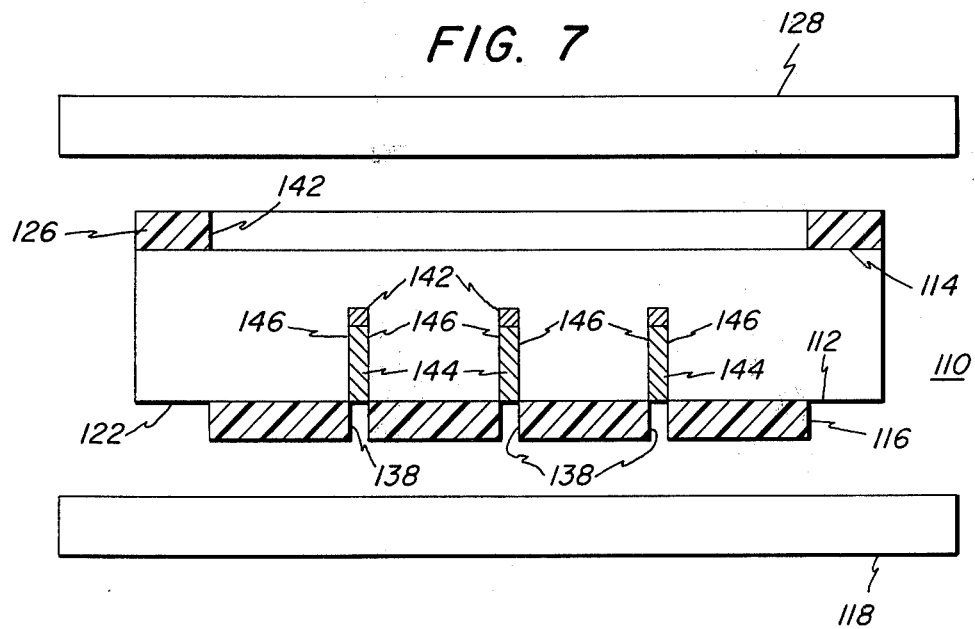

PROCESS FOR THERMAL GRADIENT ZONE MELTING UTILIZING A GUARD RING RADIATION COATING

BACKGROUND OF THE INVENTION

1. Field of the Invention

This invention relates to the manufacture of semiconductor devices and, more particularly, to a method of employing an optical coating to improve the processing of wafers of semiconductor material by thermal gradient zone melting.

2. Description of the Prior Art

In the manufacture of semiconductor devices, it is normally necessary to alter the conductivity type of a selected region, or two or more regions, of a semiconductor body by doping these regions with conductivity-modifying impurity atoms. Today, such doping is usually accomplished commercially by solid state diffusion, ion implantation, liquid epitaxial growth, or vapor epitaxial growth. Such factors, as costs, speed, junction characteristics, and the particular type of semiconductor material being used, determine which method is most practical.

A little used and less widely known technique for doping semiconductor material is thermal gradient zone melting. This technique can produce very abrupt junctions with unusual configurations and high dopant concentrations in a body of semiconductor material in a relatively short period of time. Early descriptions of such thermal migration and some of its applications are found in U.S. Pat. No. 2,813,048 issued to W. G. Pfann and in his book "Zone Melting", copyright by John Wiley and Sons, Inc. While the basic principle of thermal migration was known very early in the life of the semiconductor industry, a number of unsolved problems prevented its use as a standard processing technique by the semiconductor industry.

Thermal gradient zone melting (TGZM) is a process in which a small amount of dopant is disposed on a selected surface of a body of semiconductor material and the processed body is then exposed to a temperature gradient at an elevated temperature. The overall temperature at which the process is carried out must be sufficiently high in order to form a melt of metal-rich semiconductor material containing the dopant material. Under these conditions, the melt will migrate through solid body of material along and up the lines of heat flow from low temperatures to high temperatures, leaving in its path a recrystallized region of semiconductor material containing the solid solubility limit of the metal therein which includes the dopant material. The temperature gradient must be uniform and unidirectional if the pattern of dopant material disposed on the surface area which is on the entrance face of the wafer is to be faithfully reproduced as a recrystallized dopant zone or region in the semiconductor wafer.

One of the most difficult problems which appears to be preventing its widespread use of thermal gradient zone melting has been the ability for one to be able to generate a large uniform thermal gradient across the thickness of a thin fragile semiconductor wafer without fracturing the wafer or contaminating the wafer with undesirable impurities.

A number of means of applying a large uniform thermal gradient have been tried including a plasma torch, a gas torch, a solar mirror, a scanning electron beam, a heated anvil and infrared radiation. The most satisfactory method of those tried has been to expose one side of a semiconductor wafer to an widespread intense source of infrared radiation while at the same time exposing the opposing side of the wafer to a cold black body heat sink. For a complete description of the infrared radiation method, attention is directed to the copending application of John K. Boah, entitled "Temperature Gradient Zone Melting Utilizing Infrared Radiation," Application Ser. No. 578,807, filed May 19, 1975, now U.S. Pat. 4,001,047, and assigned to the same assignee as this application.

Although the infrared radiation method of Boah produces a uniform thermal gradient through most of a semiconductor wafer, it has been discovered that around the peripheral edges of a wafer the thermal gradients are severely distorted from their otherwise unidirectional direction, which is perpendicular to the two major opposed surfaces, in the rest of the wafer by the discontinuity associated with the peripheral edge of a wafer. On first examination, it would appear that this thermal gradient distortion should only extend inwardly the equivalent of several wafer thickness from the edge of a wafer.

With reference to FIG. 1, there is shown a wafer 10 of semiconductor material processed in the prior art by thermal gradient zone melting. The wafer 10 has opposed major surfaces 12 and 14. Migration of one or more melts of metal-rich semiconductor material is from surface 12 to surface 14 when the surface 14 is exposed to infrared radiation. The infrared radiation of Boah produces radiation 16 which is incident upon the surface 14 and travels through the wafer 10 and is reradiated from the surface 12 and edges 28 of the wafer 10 as flow lines 22. The loss of heat from the edge or edges 28 of the wafer 10 distorts the heat flow lines 20 from a course directly between and perpendicular to the major surfaces 12 and 14 to an angled course of travel. That is the heat flow lines 20 deviate from the normal to the surfaces 12 and 14, and are not parallel with each other. Such non-parallel heat flow 20 will distort, and in some instances, break up any liquid alloy melt zone migrating through the material regions of distorted heat flow in the wafer 10. Only the area, or volume of material, in the center of the wafer where the heat flow lines 20 are substantially parallel to each other and perpendicular to the major surfaces 12 and 14 of the wafer 10 is useful for commercial semiconductor processing. However, we have found experimentally that for a wafer 10 with a radius of 25.4 mm, and a thickness of 0.25 mm, that the distortion of the thermal gradient generated by a heat loss around the edge 18 of the wafer 10 extends inwardly toward the center a distance of about 3 mm from the edge 28 of the wafer 10. Thus, the area over which the thermal distortion occurs represents about twenty percent of the area and volume of the wafer 10. Semiconductor devices made within this area, or volume of material must be discarded in most cases, thereby reducing processing yields and increasing processing costs. Consequently, a strong commercial incentive exists to find a practical means of eliminating the thermal distortions in the area contiguous with the peripheral edge 18 of the semiconductor wafer 10.

In U.S. Pat. No. 3,895,967, we have previously disclosed a method by which such thermal gradient distortions can be minimized around the edge of a thick semiconductor ingot as opposed to a thin semiconductor wafer. This method employed a guard ring of semiconductor material of the same thickness as the semiconductor ingot disposed about, and spaced from, the peripheral edge of the semiconductor ingot. This guard ring ingot arrangement adjusted the thermal distortion problem radially outward into the guard ring which could be re-used over and over again and eliminated thermal gradient distortions in the semiconductor ingot that was being processed. One requirement of this method was that the space or gap between the guard ring and the semiconductor ingot has to be less than one-tenth of the thickness of the semiconductor ingot. Otherwise, the guard ring becomes less effective and thermal distortion problems still are present in the peripheral edge portion of the semiconductor ingot.

For thin semiconductor wafers, the requirement that the separation width of the between the guard ring and the wafer be less than the wafer thickness and the requirement that the guard ring and the semiconductor wafer be co-planar make the use of guard rings commercially unfeasible for a number of reasons. First, the wafer must be positioned in the guard ring without touching the guard ring. For small separations, this becomes exceedingly difficult and time consuming for mass production operations. Furthermore, the diameter of the wafers tend to vary from one lot to another requiring the costly manufacture of semiconductor guard rings for each new wafer lot. In addition, for thin wafers it is also difficult to align reproducibly the planes of the guard ring and the wafer. Without such co-planar alignment, the guard ring method will not work effectively or may even be a complete failure.

In summary then, the present methods of thermal gradient zone melting processing of thin semiconductor wafers wastes about twenty percent of a processed semiconductor wafer which must be discarded because of thermal gradient distortion problems around the peripheral edge portion of the wafer. The prior art guard ring method which eliminates this distortion in thick semiconductor ingots is commercially unfeasibly for use in processing thin wafers of semiconductor material.

It is, therefore, an object of this invention to provide a new and improved method for processing semiconductor elements, or bodies of material, by thermal gradient zone melting which overcoms the deficiencies of the prior art.

Another object of this invention is to provide a new and improved method for minimizing the thermal gradient edge distortion in thin semiconductor wafers or elements, during the practice of the thermal gradient zone melting processing.

Other objects of this invention will, in part, be obvious and will, in part, appear hereinafter.

BRIEF DESCRIPTION OF THE INVENTION

In accordance with the teachings of this invention, there is provided and improved method for processing a body of semiconductor material by thermal gradient zone melting (TGZM). The improved process includes selecting a body of semiconductor material having a preferred crystal structure, a preferred type conductivity and a preferred level of resistivity. The body has two major opposed surfaces which are, respectively, the top and bottom surfaces thereof. At least one of the major surfaces has a preferred planar crystal orientation which is one selected from the group consisting of (100), (110) and (111). The body has a vertical axis which is substantially aligned with a first crystal axis of the material of the body.

A layer of a material suitable for causing absorbtion of a predetermined range of wavelength of the radiation impinging thereupon is disposed on at least one of the two opposed major surfaces. The layer of material has a predetermined thickness, $t$, which is expressed by the following equation:

$$t = \frac{(2n-1)\lambda}{4N}$$

wherein $n$ = any positive integer greater than zero
$\lambda$ = the wavelength in vacuum of the most intense portion of the radiation spectrum impinging upon the body, and
$N$ = the index of refraction of the material layer enhancing absorbtion.

The material of the layer enhancing absorbtion is shaped in accordance to that radiation it will be exposed to during processing of the body by TGZM. The material absorbs a predetermined range of wavelengths centered about the most intense portion of the radiation spectrum. The enhanced absorbtion caused by the layer increases the heat flow lines through a predetermined portion of the material of the body.

An annular guard ring configuration disposed on the outer peripheral portion of its respective surface area of the body is formed from the layer on the major surface area exposed to a source of radiant energy. A centrally oriented disc-like configuration may be formed on the major surface of the body remote from the source of the radiant energy. The radiation impinging thereupon is emitted from the body and is derived from the original source of radiant energy after passing through the body. Formation of the disc-like configuration produces an annular low emittance guard ring on the outer peripheral portion of the same surface area. Preferably, both configurations are formed on the respective major surface areas of the body to maximize the efficiency of processing the body by TGZM. The configuration of the layers minimize the effect of thermal gradients parallel to the opposed major surfaces of the body.

Although the material of the layer may be of silicon oxide, other suitable materials are silicon nitride, aluminum oxide, aluminum nitride and the like. When the semiconductor material is silicon, the material of the layer may be of silicon oxide formed by thermal oxidation of the material of the body.

Since the material of the layer shaped to a disc-like configuration has a greater thickness than the annular guard ring, it may be formed by two or more process steps to achieve the proper thickness. An initial growth on one surface only forms a part of the layer to be shaped later. Then when the material for the annular guard ring is grown, the remainder of the material for the disc-like configuration is grown simultaneously.

It is desirable to have the disc-like configured material disposed on that portion of the major surface area that defines the volume of material of the body through which migration of the melt is practiced by TGZM. A cylindrical surface defined by the outer peripheral edge of the disc-like configuration should be an approximately the same surface as that cylindrical surface defined by the inner perpheral edge of the annular guard ring on the opposed major surface.

DESCRIPTION OF THE DRAWINGS

FIGS. 6 and 7 are side elevation views, in cross-section, of a body of semiconductor material of this invention being processed in accordance with the teachings of this invention.

DESCRIPTION OF THE INVENTION

Figure 1:
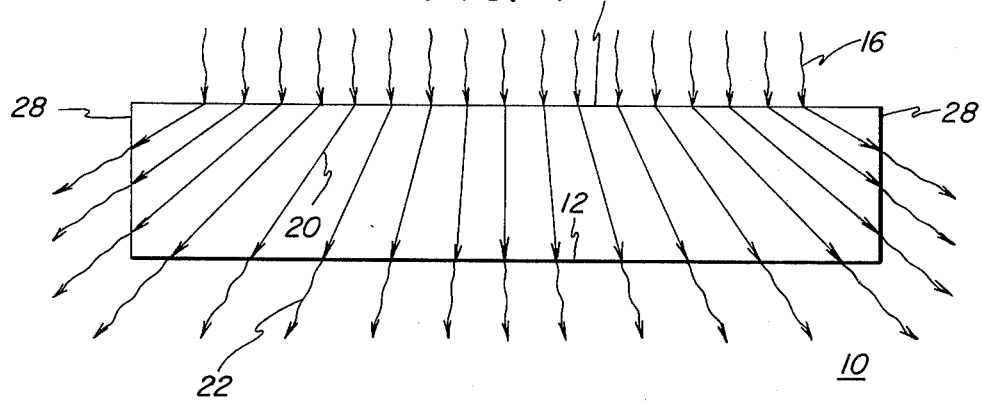
FIG. 1 is a side elevation view, in cross-section, of the heat flow lines in a body of semiconductor material processed by prior art methods.
Figure 2:
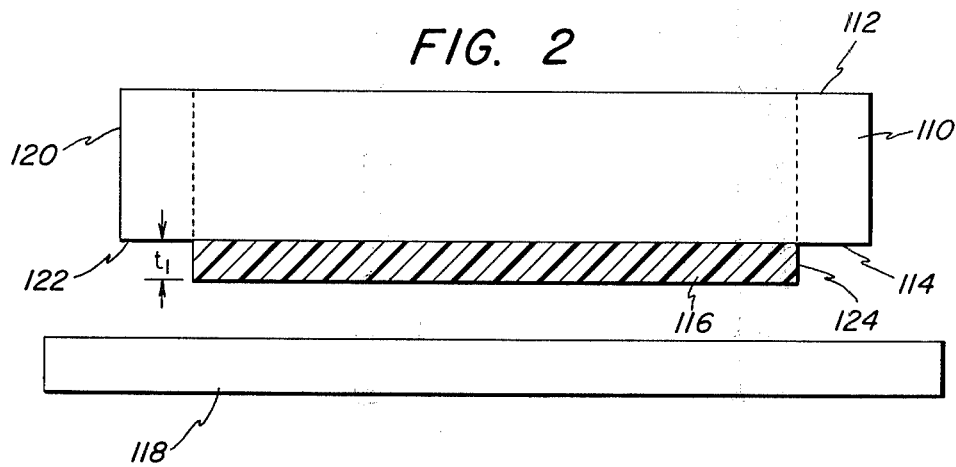
FIGS. 2, 3 and 4 are side elevation views, in cross-section, of different embodiments of a body of semiconductor material processed in accordance with the teachings of this invention.

Referring now to FIG. 2, there is shown a wafer, or body 110, of semiconductor material having opposed major surfaces 112 and 114 which are, respectively, the top and bottom surfaces thereof. The semiconductor material may be silicon, germanium, silicon carbide, gallium arsenide, a compound of a Group II element and a Group VI element and a compound of a Group III element and a Group V element. In order to describe the invention in more detail, and for no other reason, the material of the body 110 is said to be silicon of N-type conductivity.

A layer 116 of a material which is suitable for absorbing a predetermined range of wavelength of the radiation spectrum is disposed on a selected portion of the surface 114. The layer 116 has a thickness equal to a multiple of one-fourth of the wavelength $\lambda_b$ within the layer 116 of material of the most intense portion of the radiation spectrum re-radiated from the heated semiconductor wafer 110 during the practice of the process of thermal migration. The general formula for the thickness of the layer 116 is as follows:

$$t_1 = \frac{(2n-1)\lambda_b}{4} \quad (1)$$

wherein $t_1$ is the thickness of the layer 116;
$n$ is any positive integer greater than zero, and
$\lambda_b$ is a wavelength of the radiation spectrum emitted by the body 110 through surfaces 114 and defind by the following equation:

$$\lambda_b = \frac{\lambda_B}{N_c} \quad (2)$$

wherein $\lambda_B$ is the wavelength of the same radiation in vacuum, and
$N_c$ is the index of refraction of the material comprising the layer 116 and by substitution in equation (1), $t_1$ may be expressed as follows:

$$t_1 = \frac{(2n-1)\lambda_B}{4N_c}$$

The layer 116 functions as means to draw heat flow to the middle portion of the material of the body 110 by efficiently re-radiating the collected heat from the middle portion to a heat sink 118. This arrangement of the layer 116 on the surface 114 maintains the outer peripheral edge portion of the body 110 at a higher temperature relative to the middle portion in order to compensate for the heat loss through the peripheral edge 120 of the body 110. The function of the layer 116 is to focus or enhance the heat flow through the body by enhancing the radiation emittance of the surface of the body and thus maintain the heat flow lines as perpendicular as possible to the opposed major surfaces 112 and 114. The layer 116 should preferably cover at least that portion of the surface 114 which defines the volume of material of the body 110 through which the movement of a melt of metal-rich semiconductor material is practiced by thermal gradient zone melting.

The portion of the surface 114 defined by the outer peripheral edge 124 and the edge 120 functions as a low emittance guard ring 122. The low emittance guard ring 122 maintains the volume of material of the outer peripheral portion of the body 110 hotter than the middle position thereof by limiting the loss of heat by radiation to the heat sink 118 from the area 122.

Figure 3:
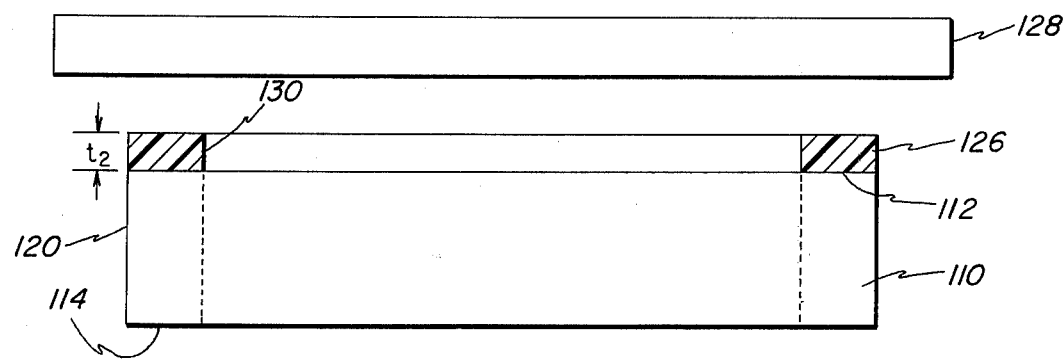

With reference now to FIG. 3, there is shown a layer 126 of a material which is suitable for absorbing a predetermined range of wavelength of the radiation spectrum disposed on a selected portion of the surface 112. The layer 126 has a thickness, $t_2$, equal to a multiple of one-fourth of the wavelength of the incident radiation from a radiant energy source 128 within the layer 126 of material. The thickness, $t_2$, is defined as follows:

$$t_2 = (2n-1)\frac{\lambda_S}{4} \quad (4)$$

wherein $t_2$ is the thickness of the layer 126;
$n$ is any positive integer greater than zero, and
$\lambda_S$ is a wavelength of the radiation spectrum emitted by the radiant energy source 128 within the layer 126 of the material layer and defined by the following equation:

$$\lambda_S = \frac{\lambda_s}{N_c} \quad (5)$$

wherein $\lambda_s$ is the wavelength of the same radiation in vacuum, and
$N_c$ is the index of refraction of the material comprising th layer 126 and by substitution in equation 4, $t_2$ may be expressed as follows:

$$t_2 = \frac{(2n-1)\lambda_s}{4N_c} \quad (6)$$

Preferably, the layer 126 is shaped in the configuration of an annular guard ring disposed on the outer peripheral portion of the surface 112. The inner edge 130 portion of the guard ring 126 is aligned approximately with the outer peripheral edge portion of the volume of material of the body 110 denoted as the migration area. One or more melts of metal-rich semiconductor material are migrated through migration area of the body 110 by thermal gradient zone melting processing. Although the melt will migrate through the material of the layer 126 as well, it is generally preferred not to practice the process in such a manner, however.

The function of the layer 126 is to enhance absorbtion of radiation from the radiant energy source 128 by interference. The enhanced absorbtion of radiation produced by the layer 126 increases the heating of the material in the outer peripheral portion of the body 110 and compensates for some of the heat loss through radiation through the edge 120. Therefore, the heat loss from the migration area is minimized and heat flow lines through the migration area are maintained perpendicular to the opposed major surfaces 112 and 114.

The guard ring layer 126 may have its inner edge 130 displaced more toward the outer peripheral edge 120. However, such an arrangement reduces the efficiency of the function of the guard ring layer 126.

Figure 4:
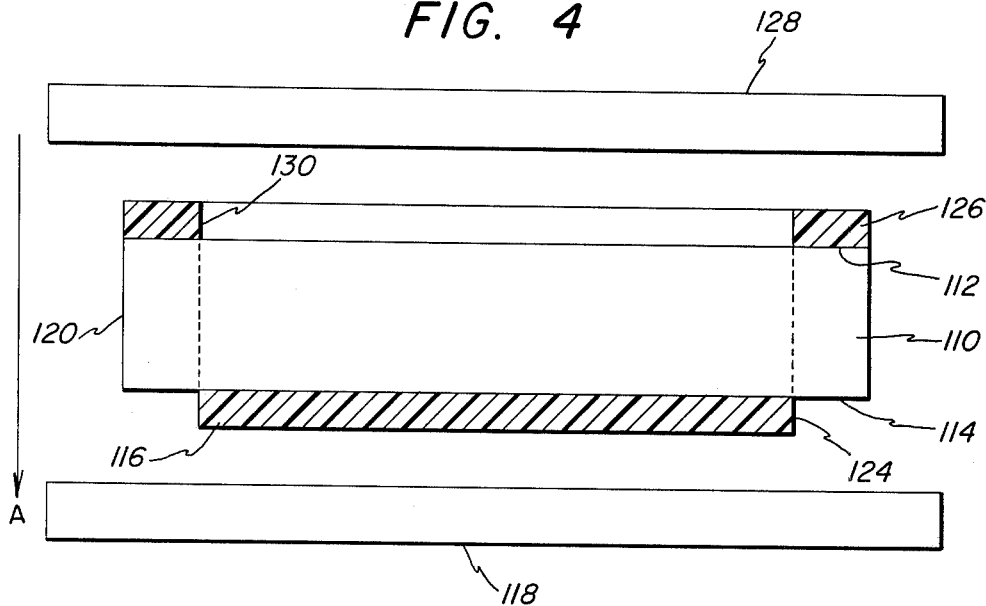
Figure 5:
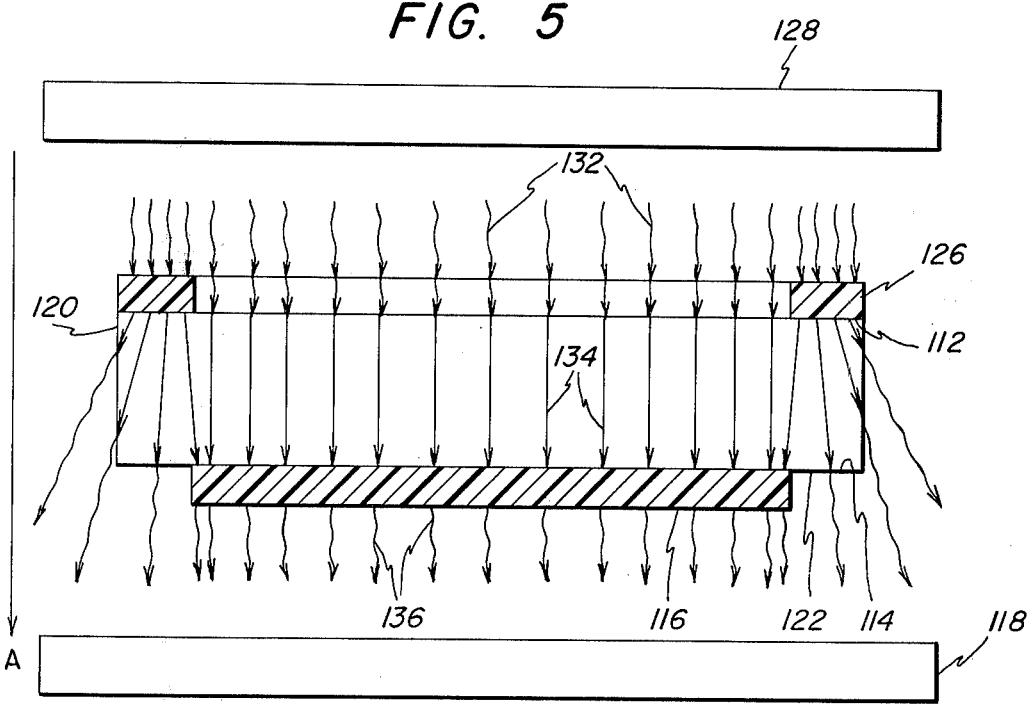
FIG. 5 is a side elevation view, in cross-section, of the heat flow lines in the body of semiconductor material of this invention.

Referring now to FIGS. 4 and 5, the preferred embodiment of the invention incorporates the employment of both layers 116 and 126 as shown. The distribution of the flow of heat through the body 110 during processing by temperature gradient zone melting is as shown. The radiation 132 from the radiant energy source 128 is incident on the major surface 112 and the layer 126 of the body 110. Because of the thickness, $t_2$, of the material of the anti-reflection layer 126 of the guard ring on surface 112, more heat is absorbed per unit area around the peripheral portion of the wafer 110 as defined by the edge 120 than on other areas of the surface 112. The absorbed heat flows through the wafer 110 and is re-radiated to heat sink 118. The heat sink 118 is maintained at a predetermined lower temperature than that of the energy source 128 to produce a thermal gradient A. Heat flow lines 134 through the migration area of the body 110 are practically perpendicular to the opposed major surfaces 112 and 114 and are maintained in such a manner as a result of the cooperative efforst of the layers 116 and 126 and the low emittance guard ring 122. More of the heat flow lines 134 are present in the outer peripheral portion of the body 110 than in the prior art devices. Therefore, that portion of the body 110 is maintained at a higher temperature. As a result the lateral thermal gradient induced in the body 110 in the migration area is negligible. The layers 116 and 126 therefore enhance the processing of the body 110 and the quality of the devices produced therefrom. The heat flow through the body 110 is re-radiated to the heat sink 118 by heat flow lines 136 emitted by the surfaces of the low emittance guard ring 122 and the layer 116.

In order that the selectively absorbing layer 126 which functions as the guard ring and the layer 116 act with maximum efficiency, the material comprising each of the layers 118 and 128 should be transparent to the wavelength of the radiation impinging thereupon and have an index of refraction $N_c$ that is the square root of the product of the index of refraction $N_b$ of the semiconductor body 110 and the index of refraction $N_o$ of the surrounding medium and is expressed by the following equation:

$$N_c = \sqrt{N_b N_o} \qquad (7)$$

Since most radiation sources of energy are not monochromatic sources of radiation, we have found that the wavelength that one must use to determine the thickness, $t_2$, of the material of the layer 126, which functions as the guard ring, is the wavelength of the most intense portion of the incident radiation spectrum. For example, utilizing GE 3200T 3/1CL Quartz Infrared Lamps available from the General Electric Company as radiation sources with a filament temperature of 2893° Kelvin, one finds that the most intense portion of the radiation spectrum is centered about a wavelength of one micron in vacuum. The passage of the radiation through the body 10 causes the wavelength of the radiation to increase in accordance with the temperature at which migration is practiced. The body 110 is at this temperature of migration. The wavelength in vacuum of the most intense radiation re-radiated from the semiconductor body 110 through the surface 114 during the practive of thermal migration is given in Table I for various processing temperatures of body 110.

Table I

| Temperature of Wafer | Wavelength of Reradiated Radiation from Wafer |
|---|---|
| 1400° C | 1.73 microns |
| 1300° C | 1.84 microns |
| 1200° C | 1.96 microns |
| 1100° C | 2.11 microns |
| 1000° C | 2.27 microns |
| 900° C | 2.45 microns |
| 800° C | 2.68 microns |

For purposes of illustration, the body 110 has been said to be a wafer of silicon. The index of refraction of silicon at a wavelength of about one micron, the wavelength of the most intense portion of the radiation spectrum of the GE lamps, is 3.7. Thus the material of the layers 116 and 118 should have an index of refraction of 1.93 and should have a transmissivity for one wavelength radiation of 100%. The material of the guard ring layer 126 and the layer 116 must also not cause any contamination or doping of the material of the wafer 110. The material also must not melt, decompose, or evaporate or otherwise be unstable at the temperature, typically 1150° C, and for the period of time, typically 5 minutes, of the thermal migration process.

We have found that silicon oxide grown on at least selected portions of the surfaces 112 and 114 of the silicon wafer 110 in an oxidizing atmosphere to the thickness required by the one-quarter wavelength criteria of each of the layers 116 and 126 closely meets all of these ideal requirements. Silicon oxide forms a stable material coating and has an index of refraction of 1.5 and a transmission coefficient of 85%. A layer 126 of silicon oxide forming the guard ring configuration with a thickness of one-quarter wavelength increases the radiation absorbed by the peripheral areas of surface 112 of the semiconductor wafer 110 by 42 percent.

The low emittance guard ring 122 is formed because of the existance of the anti-reflectance coating which is the disc-like layer 116 disposed on the selected surface area of the surface 114. This layer 116 or coating enhances the re-radiation of heat from the surface 114 to the heat sink by forty-two percent in the area on which it has been formed.

Since the thickness of each of the layers 116 and 126 is determined by the wavelength of the radiation within each layer, $t_1$, does not equal $t_2$. Further, $t_2$ is actually greater than $t_1$.

Table II gives the thickness of the layers 116 and 126 of silicon oxide required on the silicon wafer 110 to minimize thermal gradient edge distortion effects for a radiation source of GE 3200T 3/1CL High Temperature Quartz Lamps operating at a tungsten filament temperature of 2893° C for various TGZM semiconductor wafer processing temperatures.

Table II

| Wafer Temperature-° C | Thickness of layer-116-microns | Thickness of layer-126-microns |
|---|---|---|
| 1400 | 0.280 | 0.167 |
| 1300 | 0.290 | 0.167 |
| 1200 | 0.305 | 0.167 |
| 1100 | 0.328 | 0.167 |
| 1000 | 0.352 | 0.167 |
| 900 | 0.380 | 0.167 |
| 800 | 0.408 | 0.167 |
|  | 0.448 | 0.167 |

In order to grow silicon oxide from the material of the body 110 or to vapor deposit silicon oxide of the different thicknesses listed in Table III, on the respective surfaces 116 and 126, two sequential forming or deposition process steps may be practiced. Suitable processes which may be practiced for growing or depositing the layers 116 and 126 of silicon oxide on the respective surfaces 114 and 112 of the semiconductor body, or wafer, 110 include, but is not limited to, steam oxidation, oxidation in dry oxygen, anodic oxidation, gaseous anodization, pyrolysis, evaporation, reactive sputtering, carbon dioxide oxidation and oxide formation by chemical transport technique.

In order to illustrate the process steps required to form the layers 116 and 126 of the desired thickness given in Table II, the processing of a work piece or wafer 110 at an elevated temperature of 1200° C by means of oxidation in dry oxygen will be described.

A polished silicon wafer was exposed to dry oxygen at 1000° C ± 5° C for about 560 minutes to form a silicon oxide layer of approximately 0.29 microns thickness on both sides of the wafer. The processed silicon wafer was removed from the oxidation furnace and the layer of oxide corresponding to layer 126 on surface 112 of the wafer 110 in FIG. 4 was removed by selective chemical etching in a buffered hydrofluoric acid solution. The silicon wafer was disposed in the oxidation furnace again and oxidation of the wafer surface was again practiced as before for about an additional 240 minutes at 1000° C ± 5° C to grow a silicon oxide layer 116 of about 0.167 microns thickness on the surface 112 of the wafer 110 and to increase the thickness of the oxide layer on the surface 114 from about 0.290 microns to about 0.328 microns. The wafer was then removed from the oxidation furnace. Employing conventional photolithography and selective chemical etching techniques well known to those skilled in the art, the low emittance ring area 124 was formed on surface 112 and the selective absorbing ring, or guard ring 126 was formed on surface 114. At the same time, windows 138 in the coating layer 116 can be opened so that dopant can be deposited through the windows onto surface 114 of the semiconductor wafer 110 to form the patterned array 140 of dopant.

Other oxidation temperatures to form the required silicon oxide coatings may also be used. Table III, which follows, tabulates the approximate furnace time required to form the respective layers 116 and 126 at various selected temperatures.

Table III

| Oxidation Temperature | First Oxidation Time | Second Oxidation Time |
|---|---|---|
| 800° C | 6300 minutes | 4000 minutes |
| 900° C | 1700 minutes | 800 minutes |
| 1000° C | 560 minutes | 240 minutes |
| 1100° C | 210 minutes | 90 minutes |
| 1200° C | 64 minutes | 40 minutes |
| 1300° C | 56 minutes | 24 minutes |
| 1400° C | 40 minutes | 15 minutes |

The preferred embodiment of FIGS. 6 and 7 is desirable for production operations. Windows 138 are opened in the layer 116 by selective chemical etching. Depending upon the process employed, the exposed portions of the surface 112 in the window 138 may or may not be etched for receival of metal deposits therein. A layer 140 of metal which includes at least one suitable dopant material that will impart to the silicon of the body 110 a predetermined type conductivity and a predetermined level of resistivity is deposited in the windows. A suitable dopant material for N-type silicon is aluminum. The windows are arranged in a pre-selected pattern of any desired configuration. However, as illustrated in FIG. 6, the preselected pattern includes a plurality of parallel linear metal layers 140.

Preferably, the wafer 110 is oriented so that the surfaces 112 and 114 are in the (111) crystallographic plane. Under these conditions, the aluminum metal 140 will preferably migrate as part of the melt along the <111> axis of the material of the body 110. Other exemplary stability conditions for migration through the wafer 110 are as shown in Table IV.

Table V

| Wafer Plane | Migration Direction | | Stable Wire Directions | Stable Wire Sizes |
|---|---|---|---|---|
| (100) | < 100 > | | < 011 > | < 100 microns |
|  |  | | < 0$\bar{1}$1 > | < 100 microns |
| (110) | < 110 > | | < 1$\bar{1}$0 > | < 150 microns |
| (111) | < 111 > | +a) | < 0$\bar{1}$1 > |  |
|  |  |  | < 1$\bar{1}$0 > | < 500 microns |
|  |  |  | < 10$\bar{1}$ > |  |
|  |  | b) | < 11$\bar{2}$ > |  |
|  |  |  | < $\bar{2}$11 > | < 500 microns |
|  |  |  | < 1$\bar{2}$1 > |  |
|  |  | c) | Any other Direction in (111) plane* | < 500 microns |

*The stability of the migrating wire is sensitive to the alignment of the thermal gradient with the < 100 >, < 110 > and < 111 > axis, respectively.
+ Group a is more stable than group b which is more stable than group c.

The aluminum of the layer 140 is preferably alloyed to the surface 122. The alloying step helps assure uniform wetting between the silicon and the aluminum to achieve best results.

Referring now to FIG. 7, the wafer 110 is placed in a thermal migration apparatus with the surface 114 facing the radiant energy source 128 and the surface 112 facing a cold black body heat sink 118. The thermal migration process is initiated when the radiant heat source 128 is energized. First, an aluminum-rich melt 142 of silicon is formed on the surface 112 within the windows 138. Each melt 142 dissolves the silicon on the hottest side thereof (that is, as viewed in FIG. 6, above it). Concurrently, aluminum doped silicon will begin to recrystallize on the coolest side thereof (that is, as viewed in FIG. 7, below it).

Thus, the melt 142 migrates through the solid material of the wafer 110 in an upward direction. Behind the migrating melt 142, a region 144 of recrystallized silicon semiconductor material of the body 110 doped with aluminum to the solid solubility limit in silicon as determined by the temperature at which migration is practiced will be deposited.

If the process is continued for a sufficient period of time (typically 2 to 15 minutes) depending on wafer thickness, temperature, temperature gradient, etc., the melt 142 will emerge on the hot surface 114 of wafer 110. The recrystallized region 144 will pass through the entire wafer and form two parallel planar P-N junctions 146 in the wafer 110 for each melt 142 migrating through the body 110 from the surface 112.

Although the invention has been described by using aluminum as part of the melt 142, other suitable materials may be employed to impart N-type conductivity, P-type conductivity, and intrinsic type conductivity.

Other suitable materials which may be utilized for the layers 116 and 126 are silicon nitride, aluminum oxide, aluminum nitride, and the like. These materials may also be employed with other semiconductor materials where applicable.

We claim as our invention:

1. An improvement in the processing of a body of semiconductor material by thermal gradient zone melting comprising the steps of:
   a. selecting a body of semiconductor material having a preferred crystal structure, a preferred type of conductivity, a preferred level of resistivity, two major opposed surfaces being, respectively, the top and bottom surfaces of the body, at least one of the major surfaces having a preferred planar crystal orientation which is one selected from the group consisting of (100), (110) and (111), and a vertical axis substantially aligned with a first preferred crystal axis of the material of the body;
   b. forming a layer of a material suitable for absorbing or for re-radiating a predetermined range of wavelength of the most intense portion of the radiation spectrum impinging thereupon on at least one of the two major opposed surfaces, the layer having a predetermined thickness, $t$, expressed by the following general equation:

$$t = \frac{(2n - 1)\lambda}{4N}$$

wherein $n$ = any positive integer greater than zero,
   $\lambda$ = the wavelength in vacuum of the most intense portion of the radiation spectrum impinging upon the layer of material, and
   $N$ = the index of refraction of the material;
   c. shaping the first layer of material to conform to a particular configuration and to cover a predetermined surface area of the major surface of the body on which it is disposed;
   d. exposing the processed body to a source of radiant energy;
   e. absorbing the predetermined range of wavelength of the most intense portion of the radiation spectrum in the first layer, and
   f. increasing the heat flow lines through a predetermined portion of the material of the body to enhance the migration of a metal-rich semiconductor material therethrough by thermal gradient zone melting.

2. The process of claim 1 wherein
the first layer is shaped to form an annular guard ring on the outer peripheral portion of a major surface, and
exposing that surface upon which the annular guard ring is disposed to a source of radiant energy.

3. The process of claim 2 wherein
the material of the body is silicon, and
the material of the layer is silicon oxide.

4. The process of claim 3 wherein
$\lambda$ is about 1 micron.

5. The process of claim 3 wherein
the silicon oxide is formed by thermal oxidation of the material of the body.

6. The process of claim 1 wherein
the first layer is shaped to a disc-like configuration on the central portion of the major surface, and
exposing that surface to the radiation emitted by the material of the body, and including
forming an annular low emittance guard ring on the outer peripheral portion of that surface on which the disc-like configuration is formed.

7. The process of claim 6 wherein
the material of the body is silicon, and
the material of the layer is silicon oxide.

8. The process of claim 7 wherein
$\lambda$ is about 1 micron.

9. The process of claim 7 wherein
the silicon oxide is formed by thermal oxidation of the material of the body.

10. The process of claim 1 wherein
the layer of material is formed on both major opposed surfaces of the body,
the layer on the major surface to be exposed to a source of radiant energy is shaped to form an annular guard ring configuration disposed on the outer peripheral portion of that surface, and
the layer on the other major surface most remote to the source of radiant energy is shaped to form a disc-like configuration centrally disposed on its respective major surface of the body and to form a low emittance guard ring on the outer peripheral portion of that surface.

11. The process of claim 10 wherein
the material of the body is silicon, and
the material of the layer is silicon oxide.

12. The process of claim 11 wherein
$\lambda$ is about 1 micron for the wavelength impinging upon the annular guard ring and its respective surface of the body.

13. The process of claim 11 wherein
the silicon oxide is formed by the thermal oxidation of the material of the body.

14. The process of claim 11 wherein
the thickness of the layer to be shaped to a disc-like configuration is achieved by two silicon oxide forming process steps.

* * * * *